United States Patent
Park et al.

(10) Patent No.: US 9,870,932 B1
(45) Date of Patent: Jan. 16, 2018

(54) PRESSURE PURGE ETCH METHOD FOR ETCHING COMPLEX 3-D STRUCTURES

(71) Applicant: Lam Research Corporation, Fremont, CA (US)

(72) Inventors: Pilyeon Park, Santa Clara, CA (US); Joydeep Guha, Danville, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/220,785

(22) Filed: Jul. 27, 2016

(51) Int. Cl.
*H01L 21/67* (2006.01)
*H01J 37/32* (2006.01)
*H01L 27/11551* (2017.01)
*H01L 27/11578* (2017.01)

(52) U.S. Cl.
CPC .... *H01L 21/67069* (2013.01); *H01J 37/3211* (2013.01); *H01J 37/32183* (2013.01); *H01J 37/32357* (2013.01); *H01J 37/32449* (2013.01); *H01J 37/32825* (2013.01); *H01J 2237/334* (2013.01); *H01L 27/11551* (2013.01); *H01L 27/11578* (2013.01)

(58) Field of Classification Search
CPC ......... H01L 21/67069; H01L 37/32449; H01L 37/32825; H01L 37/32183; H01L 37/3211; H01L 37/32357; H01L 2237/334; H01L 27/11551; H01L 27/11578; H01J 37/32449; H01J 37/32825; H01J 37/32183; H01J 37/3211; H01J 37/32357; H01J 2237/334
See application file for complete search history.

(56) References Cited

U.S. PATENT DOCUMENTS

| | | | | |
|---|---|---|---|---|
| 4,960,488 A | * | 10/1990 | Law | C23C 16/402 134/1 |
| 6,362,110 B1 | * | 3/2002 | Marks | H01J 37/32082 257/E21.256 |
| 8,985,152 B2 | | 3/2015 | Chandrasekharan et al. | |
| 2005/0150861 A1 | * | 7/2005 | Lee | H01J 37/3244 216/2 |
| 2009/0081815 A1 | * | 3/2009 | Yamashita | H01J 37/32091 438/9 |
| 2016/0276214 A1 | * | 9/2016 | Fu | H01L 21/76816 |

OTHER PUBLICATIONS

U.S. Appl. No. 62/294,603, filed Feb. 12, 2016, Kwame Eason.
U.S. Appl. No. 62/275,837, filed Jan. 7, 2016, Jason Lee Treadwell.
U.S. Appl. No. 14/945,680, filed Nov. 19, 2015, John Drewery.
U.S. Appl. No. 14/576,020, filed Dec. 18, 2014, Ivan L. Berry III.

* cited by examiner

*Primary Examiner* — Duy Deo
*Assistant Examiner* — Mahmoud Dahimene

(57) ABSTRACT

A method for etching a substrate and removing byproducts includes a) setting process parameters of a processing chamber for a selective dry etch process; b) setting process pressure of the processing chamber to a first predetermined pressure in a range from 1 Torr to 10 Torr for the selective dry etch process; c) selectively etching a first film material of a substrate relative to a second film material of the substrate in the processing chamber during a first period; d) lowering pressure in the processing chamber to a second predetermined pressure that is less than the first predetermined pressure by a factor greater than or equal to 4; and e) purging the processing chamber at the second predetermined pressure for a second period.

19 Claims, 6 Drawing Sheets

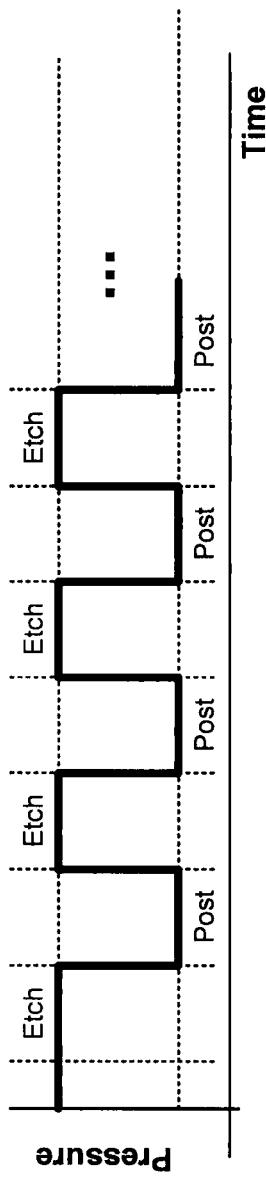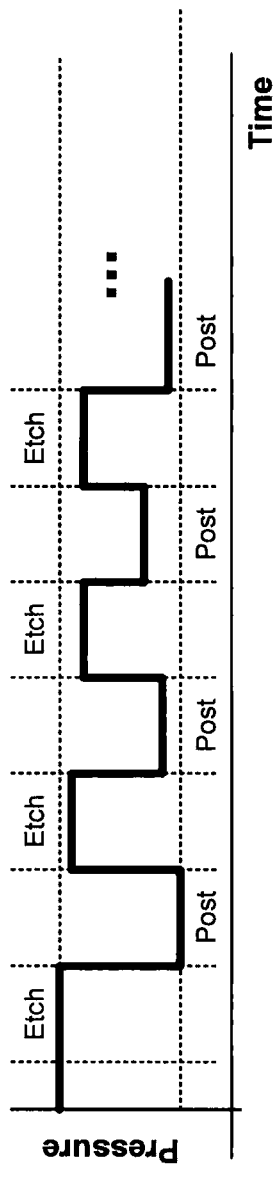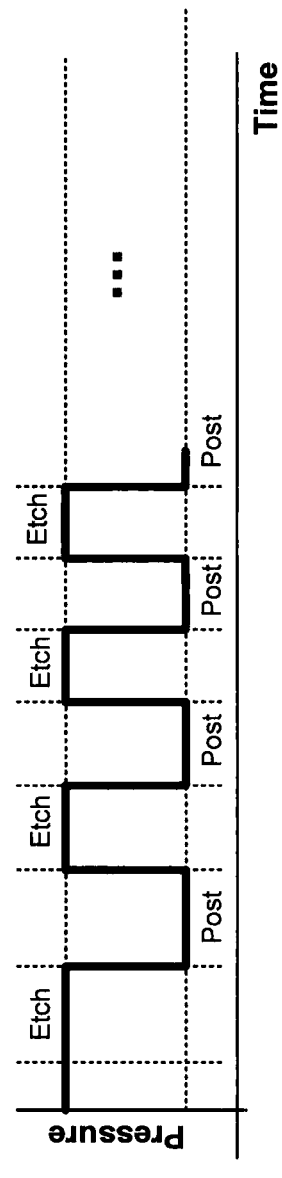

PRESSURE PURGE ETCH METHOD FOR ETCHING COMPLEX 3-D STRUCTURES

FIELD

The present disclosure relates to substrate processing systems and methods, and more particularly to substrate processing systems and methods for selective etching of one film material relative to other film materials and removal of etch byproducts.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and plasma may be used to activate chemical reactions.

NAND flash memory uses dense 3D structures in order to increase memory capacity while maintaining low cost per bit and without degrading performance. Creating the 3D structures involves depositing and etching multiple layers of different films. Etching film from the 3D structures is particularly difficult because etch byproducts such as fluorine are often trapped in the 3D structures, which leads to defects and device failures.

When integrating some semiconductor substrates such as the 3-D NAND flash memory devices, one type of film (such as silicon nitride (SiN) film) needs to be etched with very high selectivity to another type of film (such as silicon dioxide ($SiO_2$), polysilicon, etc.). Wet etching processes such as hot phosphoric acid are typically used for selectively etching the SiN film. Hot phosphoric acid has several limitations including meeting selectivity requirements with respect to low density oxide, particle and defect control (particularly in oxide fins), slow etch rate, pattern collapse from surface tension, high cost due to expensive wet chemicals and chemical waste management.

SUMMARY

A method for etching a substrate and removing byproducts includes a) setting process parameters of a processing chamber for a selective dry etch process; b) setting process pressure of the processing chamber to a first predetermined pressure in a range from 1 Torr to 10 Torr for the selective dry etch process; c) selectively etching a first film material of a substrate relative to a second film material of the substrate in the processing chamber during a first period; d) lowering pressure in the processing chamber to a second predetermined pressure that is less than the first predetermined pressure by a factor greater than or equal to 4; and e) purging the processing chamber at the second predetermined pressure for a second period.

In other features, the method includes repeating a) through e) N times, where N is an integer greater than one.

In other features, the method includes repeating b) through e) N times, where N is an integer greater than one.

In other features, the method includes varying at least one of the first predetermined pressure and the first period during at least one of the N times.

In other features, the method includes varying at least one of the second predetermined pressure and the second period during at least one of the N times.

In other features, the selective dry etch process uses remote plasma. The remote plasma is maintained during b) through e). The remote plasma is ignited prior to c) and extinguished after c). The remote plasma is generated using process gas including fluorine gas.

In other features, the processing chamber includes an upper chamber region; an inductive coil arranged outside of the upper chamber region; a lower chamber region including a substrate support; and a gas dispersion device arranged between the upper chamber region and the lower chamber region. The gas dispersion device includes a plurality of holes in fluid communication with the upper chamber region and the lower chamber region. Inductively coupled plasma is generated in the upper chamber region by supplying power to the inductive coil.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 3A to 3C are graphs illustrating examples of variation of process periods and pressures according to the present disclosure;

In the drawings, reference numbers may be reused to identify similar and/or identical elements.

DETAILED DESCRIPTION

The present disclosure relates to systems and methods for increasing etch efficiency during selective etching of one type of film material of a substrate relative to another type of film material of the substrate using a dry etch process. In some examples, the substrate is a memory device that includes 3-D structures, although other types of devices can be used. The present disclosure describes systems and methods for selective etching and removing byproducts after the selective dry etch process without additional plasma treatment. The approach described herein also helps with outgassing in the substrate.

In some examples, the systems and methods according to the present disclosure create a pressure difference between an etch step and a purge step following the etch step. In some examples, the etch and purge steps can be modified depending on the geometry of structures and the amount of byproducts that are produced. For example, the number of etch/purge steps, specific gas flows, pressures, and periods can be modified as needed.

For example only, the method according to the present disclosure can be used to etch SiN film in 3D NAND devices selective to $SiO_2$ film. In other examples, the method according to the present disclosure can be used to etch other 3D structures such as tungsten (W) (selective to $SiO_2$) recess after W deposition in 3D NAND devices.

Figure 1A:
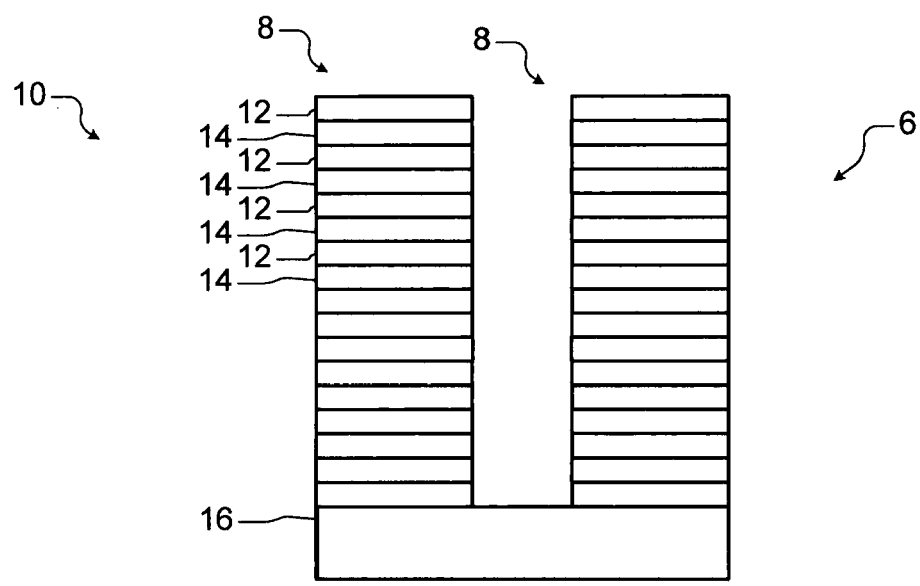
FIGS. 1A and 1B are side cross-sectional views of an example of a substrate including stacks of alternating layers of a first film material that is selectively etched relative to a second film material according to the present disclosure.
Figure 1B:
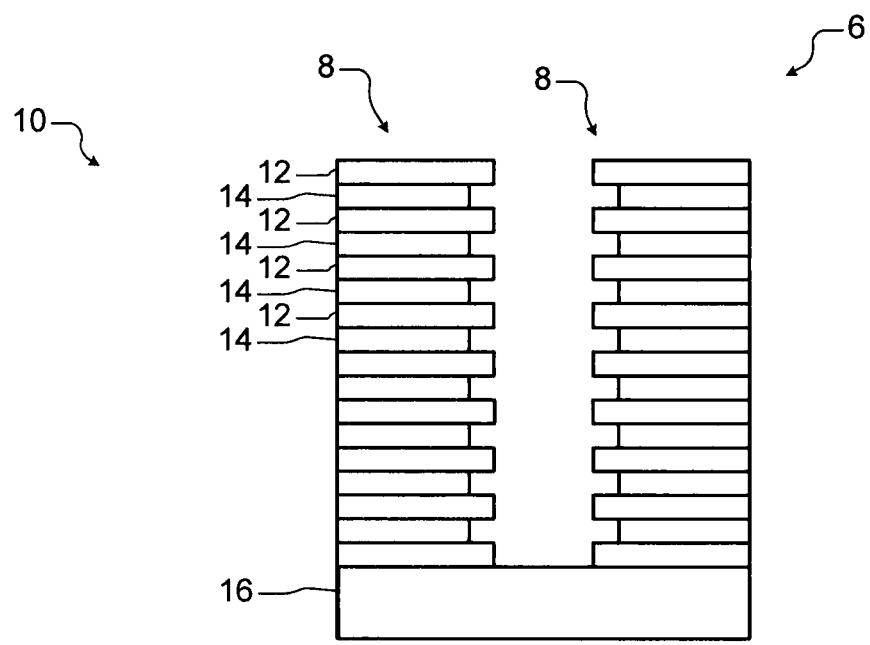

In FIGS. 1A-1B, a substrate 6 includes one or more stacks 8 arranged on one or more underlying layers 16. The stacks 8 include alternating layers 10 such as fins 12 and intervening layers 14. In some examples, the fins 12 are made of $SiO_2$ and the intervening layers 14 are made of SiN. During processing, the layers 14 need to be etched inwardly relative to ends of the fins 12 as can be seen in FIG. 1B. As can be appreciated, the stacks 8 are arranged in close proximity. In addition to selective etching, byproducts of the etch process need to be removed from the substrate 6.

Figure 2:
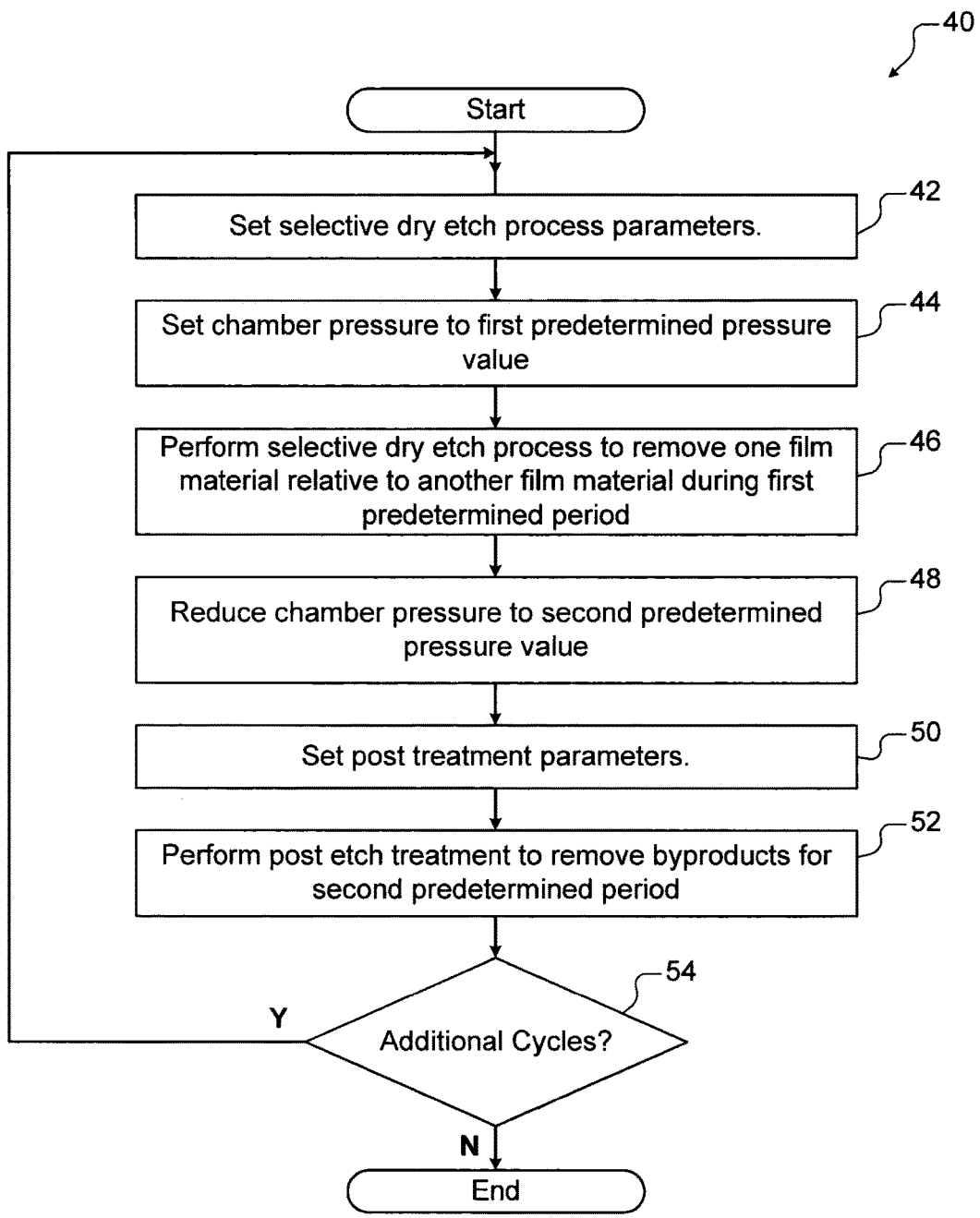
FIG. 2 is a flowchart illustrating an example of a method for selective dry etching and removing byproducts according to the present disclosure.

Referring now to FIG. 2, a method 40 for selectively etching a first type of film relative to a second type of film of a substrate and removing etch byproducts is shown. At 42, selective dry etching process parameters of a processing chamber are set. At 44, chamber pressure is set to a first predetermined pressure value for the selective dry etch process. At 46, the selective dry etch process is performed to remove one type of film selectively relative to another type of film during a first predetermined period.

In some examples, the process parameters of the selective dry etch are optimized for selective removal of SiN. Examples of systems and methods for performing selective dry etch are described in "Ultrahigh Selective Nitride Etch to Form FinFET Devices", U.S. Patent Provisional Application Ser. No. 62/294,603, filed on Feb. 12, 2016, which is hereby incorporated by reference in its entirety. Additional examples of systems and methods for performing selective dry etch are described in "Selective Nitride Etch", U.S. patent application Ser. No. 14/576,020 filed Dec. 18, 2014, which is hereby incorporated by reference in its entirety.

At 48, the chamber pressure is significantly reduced from the first predetermined pressure value for etching to a second predetermined pressure value for purging. In some examples, the first predetermined pressure is in a range from 1 Torr 10 Torr and is reduced by a factor greater than or equal to 4. At 50, the purge parameters of the processing chamber are set. At 52, the purge step is performed to remove byproducts of the dry etch process during a second predetermined period at the second predetermined pressure.

For example only, the selective dry etch step may be performed at 2 Torr (T). During the purge step, the pressure is reduced from 2 T to less than or equal to 500 mT or lower, although other pressure values can be used. In some examples, the pressure during the purge step is reduced to less than or equal to 200 mT, although other pressure values can be used. Due to the lower pressure during the purge step, etch byproducts are efficiently pumped out of complex 3D structures of the NAND device and the concentration of etch byproduct over the substrate surface falls. The reduction creates a steep gradient of chemical potential between outer locations of the substrate surface and locations inside of the 3D structures. The chemical potential gradient increases the diffusion of etch byproduct from inside of the 3D structures.

The increase in etch byproduct that is pumped out during one etch/purge cycle helps to increase the efficiency of the etch process during the following cycle since the byproducts are removed mid-process. In some examples, 3 to 10 etch/purge cycles are performed over a combined period from 3 to 20 minutes. In some examples, 6 etch/purge cycles are performed during a combined period of 8 to 10 minutes.

In examples using fluorine process gas during etching, the lower pressure purge step extracts excess fluorine from the 3D structures and prevents subsequent damage to the 3D structures caused by the fluorine. In some examples, the purge step can be performed at the end of two or more etch cycles or between each etch cycle. The etch/purge periods can be constant or variable periods. In addition, RF plasma power can be varied during etch and purge step or held constant. In addition, the etch and purge step pressures can be constant or varied. The purge step can be performed with inert gas and no other process gases in the processing chamber, with low pressure process gases without plasma, or with low pressure process gases with plasma.

If additional etch/purge cycles are to be performed as determined at 54, the method returns to 42. Otherwise the method ends.

Referring now to FIGS. 3A to 3C, the process periods and process pressures during the dry selective etching and/or purge steps can remain the same, respectively, for each of the cycles as shown in FIG. 3A. Alternately, the process periods and/or process pressures can be varied (increased or decreased), respectively, during the dry etching and/or purge steps for one or more of the cycles. In FIG. 3B, the pressure is varied. In FIG. 3C, the process periods are varied. As can be appreciated, other combinations are contemplated.

Figure 4:
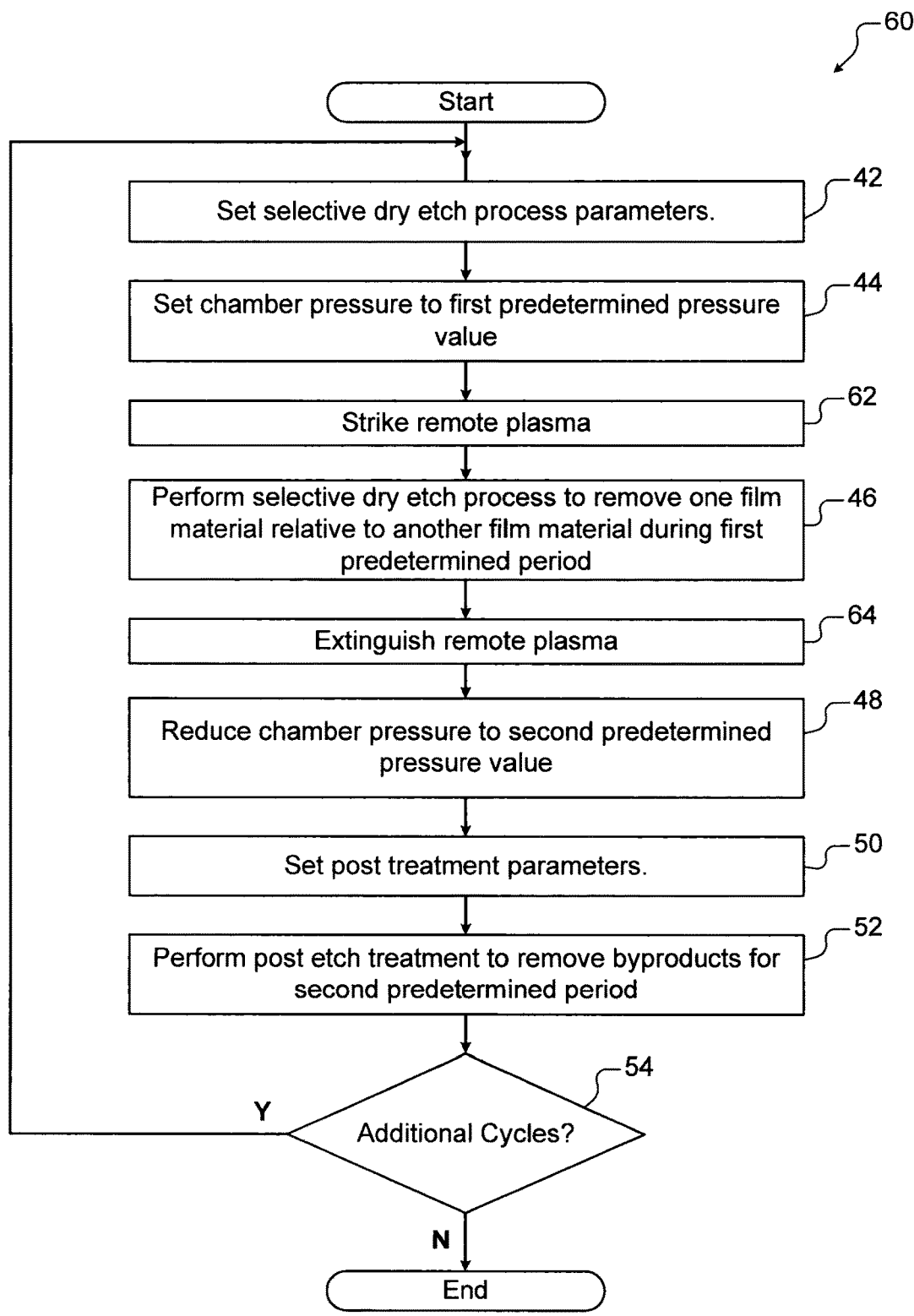
FIGS. 4 and 5 are flowcharts illustrating other example of methods for selective dry etching and removing byproducts according to the present disclosure.

Referring now to FIG. 4, another example of a method 60 for selectively etching a first film relative to a second film of a substrate and removing etch byproducts is shown. As can be appreciated, the remote plasma may be left on during the purge step (as in FIG. 2) if the plasma is capable of remaining ignited at lower pressures used during the purge step. Alternately, the plasma can be extinguished during the purge step. At 62, the remote plasma is struck at 62 before performing step 46. After performing step 46, the remote plasma is extinguished at 64.

In some examples, the selective dry etch process is used to selectively etch SiN relative to $SiO_2$ in a 3D NAND memory device, although types of film or devices can be used. In some examples, the etch/purge process includes multiple etch/purge cycles. In some examples, the process employs between 4 and 10 process cycles. For example, the edge/purge process may employ 6 etch/purge cycles. In some examples, the SiN film that is to be etched is located in recessed areas of the 3D NAND memory device.

In some examples, the chamber pressure during the selective dry etch is in a range between 1 Torr and 10 Torr, although higher or lower chamber pressures may be used. In some examples, the chamber pressure during the selective dry etch is in a range between 1 Torr and 3 Torr, although higher or lower chamber pressures may be used. In some examples, the chamber pressure during the purge step is in a range between 100 mTorr and 1 Torr, although higher or lower chamber pressures may be used. In some examples, the chamber pressure during the purge step is in a range between 100 mTorr and 500 mTorr, although higher or lower chamber pressures may be used. In some examples, the chamber pressure during the purge step is reduced by a factor of 4 to 20 relative to the chamber pressure used during the selective dry etch process, although higher or lower factors may be used. In some examples, the chamber pressure during the purge step is reduced by a factor of 4 to 10 relative to the chamber pressure used during the selective dry etch process, although higher or lower factors may be used.

Figure 5:
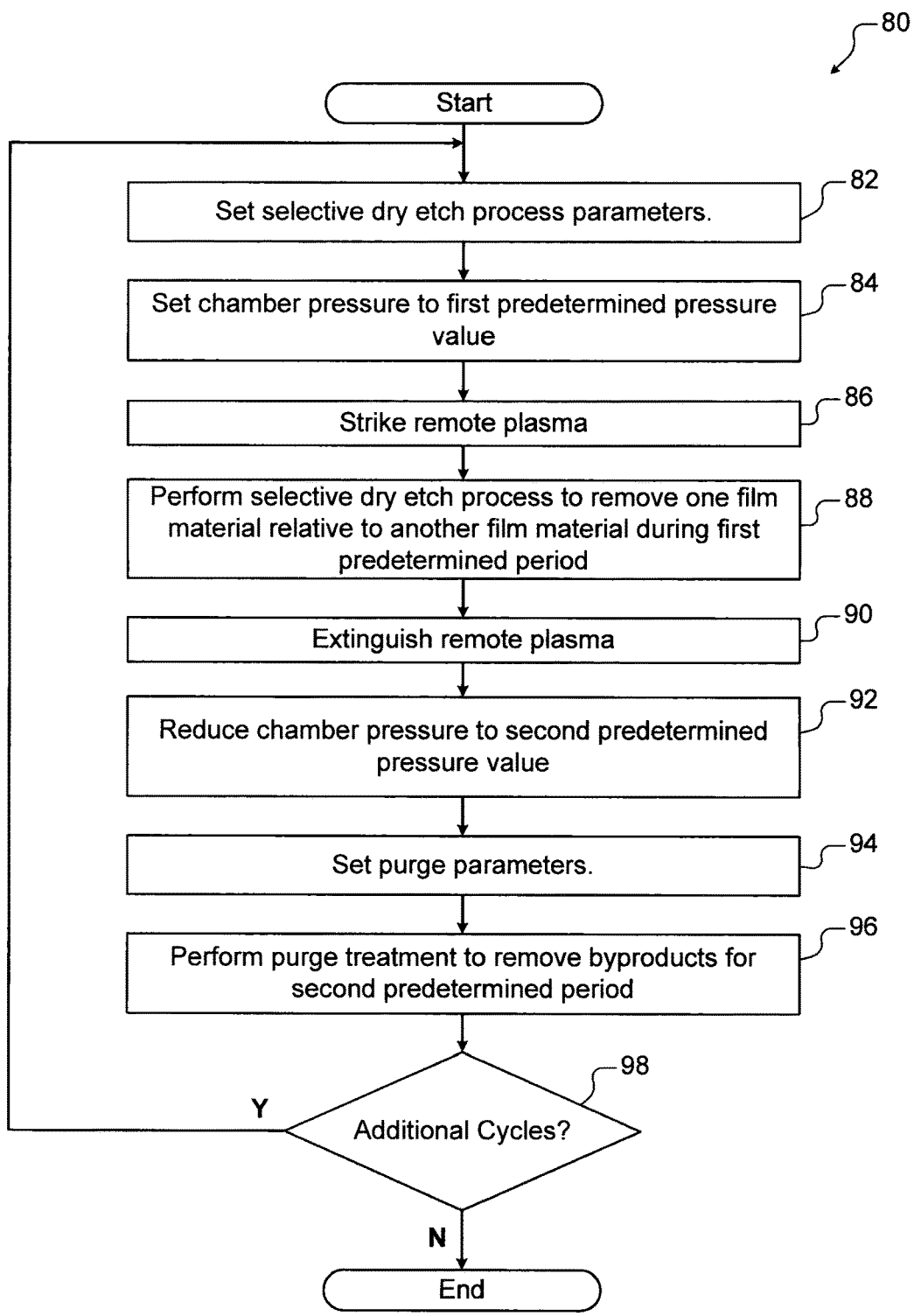
Figure 6:
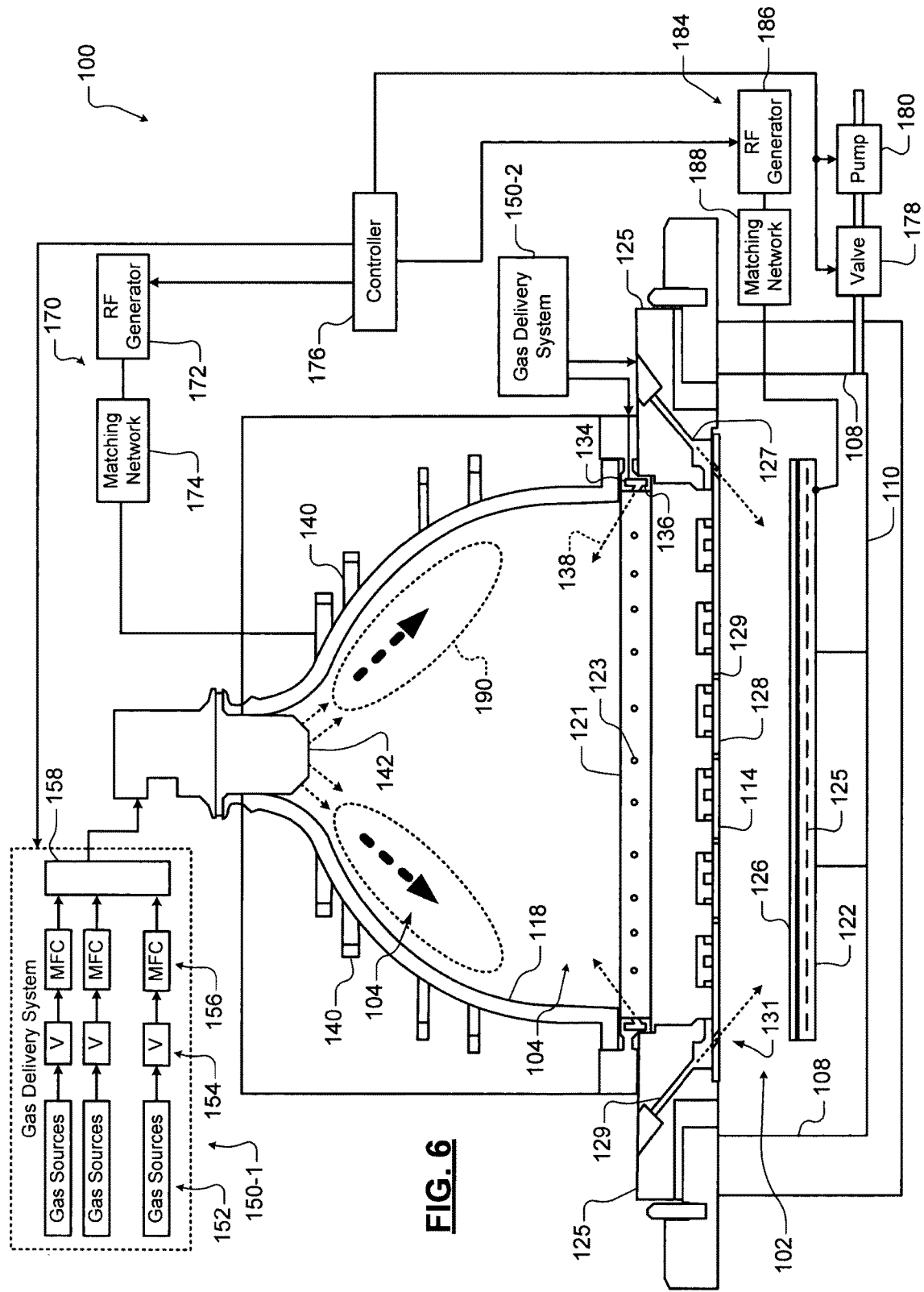
FIG. 6 is a functional block diagram of an example of an inductively coupled plasma (ICP) substrate processing chamber for selectively etching silicon nitride film according to the present disclosure.

Referring now to FIG. 5, an example of a substrate processing chamber 100 for selective dry etching and byproduct removal according to the present disclosure is shown. In some examples, the substrate processing chamber 100 is used to etch SiN film relative to $SiO_2$ film in a 3D NAND structure. While a specific substrate processing chamber is shown and described, the methods described herein may be implemented on other types of substrate processing systems. In some examples, the substrate processing chamber 100 includes a downstream inductively coupled plasma (ICP) source. An optional capacitively coupled plasma (CCP) source may be provided.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114. In some examples, the gas distribution device 114 is omitted.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 125 that defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 104. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 125, an optional cooling plate with fluid channels and one or more sensors (not shown); although any other suitable substrate support temperature control system may be used.

In some examples, the gas distribution device 114 includes a showerhead (for example, a plate 128 having a plurality of spaced holes 129). The plurality of spaced holes 129 extend from the upper surface of the plate 128 to the lower surface of the plate 128. In some examples, the spaced holes 129 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Nov. 19, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

The systems and methods according to the present disclosure provide a selective dry etch process with byproduct removal that improves throughput and decreases cost of ownership. The methods described herein make it more feasible to selectively remove film in complicated 3D structures without pattern collapse. The low pressure purge sequence after the selective dry etch increases etch efficiency and helps to reduce fluorine in the 3D structures thereby preventing damage to the 3D structures due to fluorine attack.

The method according to the present disclosure creates a chemical potential gradient between the substrate surface and inside portions of the 3D structures thereby increasing diffusion of etch byproducts.

In some examples, the processing chamber described above can be configured with a relatively small volume (55L) for a single station and high total gas flow. Due to high gas flow, residence time is very low, which helps to purge out the main etch gases very quickly. In some examples, the processing chamber uses an inductively coupled plasma (ICP) source to generate high density plasma, which diffuses out through the showerhead and contacts the wafer. Due to the downstream nature of the reactive species, SiN film is etched with very high selectivity to $SiO_2$. High density of radicals pass through the grounded showerhead and chemically modify the film's surface. Dangling bonds are formed on the SiN surface during desorption. Fluorine radicals start to remove nitride. On other surfaces, oxide and poly form a thermodynamically stable monolayer, which is immune to fluorine attack. Since the 3D structures are complicated, there is a high probability that volatile byproducts will be trapped inside of the 3D structure. The pressure/purge treatment described herein effectively removes the byproducts.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for etching a substrate and removing byproducts, the substrate comprising a stack including a plurality of first layers and a plurality of second layers, the first layers alternating with the second layers, the method comprising:
   a) setting process parameters of a processing chamber for a selective dry etch process;
   b) setting process pressure of the processing chamber to a first predetermined pressure in a range from 1 Torr to 10 Torr for the selective dry etch process;
   c) selectively etching a portion of one of the first layers relative to one of the second layers in the processing chamber during a first period;
   d) lowering pressure in the processing chamber to a second predetermined pressure that is less than the first predetermined pressure by a factor greater than or equal to 4 in order to purge the processing chamber at the second predetermined pressure for a second period;
   e) purging the processing chamber at the second predetermined pressure for the second period; and
   repeating a) through e) or b) through e) N times, where N is an integer greater than one.

2. The method of claim 1, further comprising varying at least one of the first predetermined pressure and the first period during at least one of the N times.

3. The method of claim 1, further comprising varying at least one of the second predetermined pressure and the second period during at least one of the N times.

4. The method of claim 1, wherein the selective dry etch process uses remote plasma.

5. The method of claim 4, wherein the remote plasma is maintained during b) through de).

6. The method of claim 4, wherein the remote plasma is ignited prior to c) and extinguished after c).

7. The method of claim 4, wherein the remote plasma is generated using process gas including fluorine gas.

8. The method of claim 1, wherein the processing chamber includes:
   an upper chamber region;
   an inductive coil arranged outside of the upper chamber region;
   a lower chamber region including a substrate support; and
   a gas dispersion device arranged between the upper chamber region and the lower chamber region.

9. The method of claim 8, wherein:
   the gas dispersion device includes a plurality of holes in fluid communication with the upper chamber region and the lower chamber region; and
   inductively coupled plasma is generated in the upper chamber region by supplying power to the inductive coil.

10. A method for etching a substrate and removing byproducts, the substrate comprising a stack including a plurality of first layers and a plurality of second layers, the first layers alternating with the second layers, comprising:
    a) setting process parameters of a processing chamber for an etch process;
    b) setting process pressure of the processing chamber to a first predetermined pressure in a range from 1 Torr to 3 Torr for the etch process;
    c) selectively etching a portion of one of the first layers relative to one of the second layers in the processing chamber during a first period;
    d) lowering pressure in the processing chamber to a second predetermined pressure that is less than the first predetermined pressure by a factor greater than or equal to 4 in order to purge the processing chamber at the second predetermined pressure for a second period;
    e) purging the processing chamber at the second predetermined pressure for the second period; and
    f) repeating b) through e) N times, where N is an integer greater than one.

11. The method of claim 10, further comprising varying at least one of the first predetermined pressure and the first period during at least one of the N times.

12. The method of claim 10, further comprising varying at least one of the second predetermined pressure and the second period during at least one of the N times.

13. The method of claim 10, wherein the etch process uses remote plasma.

14. The method of claim 13, wherein the remote plasma is maintained during b) through de).

15. The method of claim 13, wherein the remote plasma is ignited prior to c) and extinguished after c).

16. The method of claim 13, wherein the remote plasma is generated using process gas including fluorine gas.

17. The method of claim 10, wherein the processing chamber includes:
   an upper chamber region;
   an inductive coil arranged outside of the upper chamber region;
   a lower chamber region including a substrate support; and
   a gas dispersion device arranged between the upper chamber region and the lower chamber region.

18. The method of claim 17, wherein:
   the gas dispersion device includes a plurality of holes in fluid communication with the upper chamber region and the lower chamber region; and
   inductively coupled plasma is generated in the upper chamber region by supplying power to the inductive coil.

19. A method for etching a substrate and removing byproducts, the substrate comprising a stack including a plurality of first layers and a plurality of second layers, the first layers alternating with the second layers, the method comprising:
   a) setting process parameters of a processing chamber for a selective dry etch process;
   b) setting process pressure of the processing chamber to a first predetermined pressure for the selective dry etch process;
   c) selectively etching a portion of one of the first layers relative to one of the second layers in the processing chamber during a first period;
   d) lowering pressure in the processing chamber to a second predetermined pressure that is less than the first predetermined pressure in order to purge the processing chamber at the second predetermined pressure for a second period;
   e) purging the processing chamber at the second predetermined pressure for the second period; and
   f) repeating a) through e) or b) through e) N times, where N is an integer greater than one.

* * * * *